(12) United States Patent
Yoon et al.

(10) Patent No.: US 9,263,652 B2
(45) Date of Patent: Feb. 16, 2016

(54) SEMICONDUCTOR LIGHT-EMITTING DEVICE

(71) Applicant: SAMSUNG ELECTRONICS CO., LTD., Suwon-si (KR)

(72) Inventors: Ju-heon Yoon, Hwaseong-si (KR);
Gi-bum Kim, Hwaseong-si (KR);
Sang-yeon Kim, Seongnam-si (KR);
Sang-yeob Song, Suwon-si (KR);
Won-goo Hur, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 14/154,312

(22) Filed: Jan. 14, 2014

(65) Prior Publication Data

US 2014/0252390 A1    Sep. 11, 2014

(30) Foreign Application Priority Data

Mar. 11, 2013    (KR) ................ 10-2013-0025751

(51) Int. Cl.
*H01L 33/00* (2010.01)
*H01L 33/60* (2010.01)
*H01L 33/40* (2010.01)
*H01L 33/46* (2010.01)

(52) U.S. Cl.
CPC .............. *H01L 33/60* (2013.01); *H01L 33/405* (2013.01); *H01L 33/46* (2013.01); *H01L 2224/13* (2013.01)

(58) Field of Classification Search
CPC ......... H01L 33/10; H01L 33/46; H01L 33/60; H01L 33/405; H01L 2224/13

USPC .................................. 257/13, 98, E33.067
See application file for complete search history.

(56) References Cited

U.S. PATENT DOCUMENTS

| 6,734,468 | B2 | 5/2004 | Uemura et al. |
| 7,122,398 | B1 | 10/2006 | Pichler |
| 7,164,158 | B2 | 1/2007 | Stein et al. |
| 7,449,727 | B2 | 11/2008 | Sato et al. |
| 7,491,974 | B2 | 2/2009 | Nagai et al. |
| 7,943,942 | B2 | 5/2011 | Jiang et al. |
| 2005/0093008 | A1* | 5/2005 | Suehiro et al. ............... 257/98 |
| 2005/0279990 | A1* | 12/2005 | Liu ................ H01L 33/38 257/13 |
| 2007/0131947 | A1 | 6/2007 | Han |
| 2008/0128733 | A1* | 6/2008 | Yoo ........................ 257/98 |
| 2008/0132036 | A1 | 6/2008 | Yang |
| 2010/0006883 | A1 | 1/2010 | Slater, Jr. et al. |
| 2011/0133159 | A1 | 6/2011 | Jiang et al. |
| 2011/0147705 | A1 | 6/2011 | Jiang et al. |
| 2011/0260187 | A1* | 10/2011 | Kim ......................... 257/98 |
| 2014/0061704 | A1* | 3/2014 | Yamada et al. ............. 257/98 |

FOREIGN PATENT DOCUMENTS

JP    2007-158021 A    6/2007

* cited by examiner

*Primary Examiner* — Colleen A Matthews
*Assistant Examiner* — Colleen E Snow
(74) *Attorney, Agent, or Firm* — Sughrue Mion, PLLC

(57) ABSTRACT

A semiconductor light-emitting device includes a semiconductor region having a light-emitting structure, an electrode layer formed on the semiconductor region, and a reflective protection structure extending exposing the upper surface of the electrode layer and covering the semiconductor region adjacent to the electrode layer.

10 Claims, 12 Drawing Sheets

SEMICONDUCTOR LIGHT-EMITTING DEVICE

CROSS-REFERENCE TO RELATED APPLICATIONS

This application claims priority from Korean Patent Application No. 10-2013-0025751, filed on Mar. 11, 2013, in the Korean Intellectual Property Office, the disclosure of which is incorporated herein by reference in its entirety.

BACKGROUND

The inventive concept relates to a light-emitting device, and more particularly, to a semiconductor light-emitting device including an electrode formed on a semiconductor layer.

Light-emitting diodes (LEDs), which are semiconductor light-emitting devices, are widely used in various light-sources, lighting devices, signal lamps, and as backlighting in large display devices. As the LED market for illumination has expanded and products having high current and high output have been required, there is a demand for a technology that improves the reliability of an electrode for electrically connecting a semiconductor layer of an LED to an external structure, such as a module, and improving light extraction efficiency of a device.

SUMMARY

Methods and apparatuses according to exemplary embodiments provide a semiconductor light-emitting device, which can improve the reliability of an electrode for electrically connecting a semiconductor layer of a light-emitting diode (LED) to an external structure, such as a module or a package, and improve light extraction efficiency of the semiconductor light-emitting device.

According to an aspect of an exemplary embodiment, there is provided a semiconductor light-emitting device including: a semiconductor region including a light-emitting structure; an electrode layer disposed on an upper surface of the semiconductor region; and a reflective protection structure extending from an upper surface of the electrode layer to the upper surface of the semiconductor region, the reflective protection structure comprising at least one first hole that exposes the upper surface of the electrode layer, wherein the reflection protection structure covers a portion of the semiconductor region adjacent to the electrode layer.

The reflective protection structure may be formed of at least one of an oxide, a nitride, an oxynitride, metal, and an alloy.

The reflective protection structure may include at least one of a total reflection structure formed of an insulating layer, a metallic reflector film, a distributed Bragg reflector (DBR) structure, and an omni-directional reflector (ODR).

The reflective protection structure may include a multi-reflective layer in which a first layer having a first refractive index and a second layer having a second refractive index smaller than the first refractive index, wherein the first layer and the second layer are stacked.

The reflective protection structure may further include a metallic reflector film formed of at least one of Ag, Al, Ni, Cr, Pd, Cu, Pt, Sn, W, Au, Rh, Ir, Ru, Mg, Zn, and Ti.

The reflective protection structure may include an insulating thin film and a metallic reflector film formed on the insulating thin film. The metallic reflector film may be spaced apart from the electrode layer having the insulating thin film disposed therebetween.

The reflective protection structure may have a shape surrounding an interface between the semiconductor region and the electrode layer and a sidewall of the electrode layer.

The semiconductor light-emitting device of claim may further include: an insulating film covering the electrode layer and the reflective protection structure on the semiconductor region and including at least one second hole communicated with the at least one first hole and exposing the upper surface of the electrode layer. The reflective protection structure and the insulating film may be formed of different insulating materials. The reflective protection structure and the insulating film may be formed of the same insulating material.

The semiconductor light-emitting device may further include: a bonding conductive layer contacting the electrode layer through the at least one first hole and the at least one second hole, wherein the bonding conductive layer includes a part surrounded by the reflective protection structure.

According to another aspect of the inventive concept, there is provided a semiconductor light-emitting device including: a light-emitting structure including a first semiconductor layer, an active layer, and a second semiconductor layer; a first electrode layer disposed on the first semiconductor layer; a second electrode layer disposed on the second semiconductor layer; and a reflective protection structure extending from an upper surface of the second electrode layer to an upper surface of the second semiconductor layer, the reflective protection structure comprising at least one first hole exposing the upper surface of the second electrode layer and the reflective protection structure covering a portion of the second semiconductor layer adjacent to the second electrode layer.

The reflective protection structure may include an insulating structure having a refractive index smaller than a refractive index of the second semiconductor layer.

The reflective protection structure may include a plurality of insulating thin films formed of different materials.

The reflective protection structure may include an insulating structure contacting the second semiconductor layer and a metallic reflector film spaced apart from the second semiconductor layer and formed on the insulating structure.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXEMPLARY EMBODIMENTS

Figure 1:
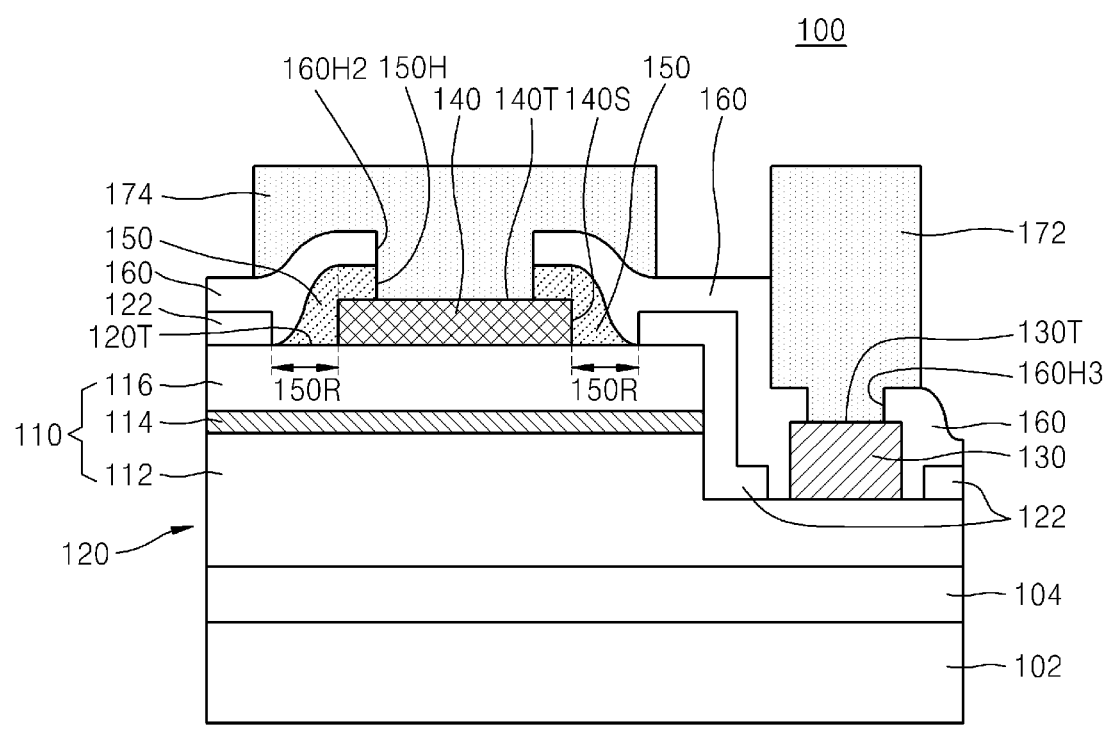
FIG. 1 is a cross-sectional view illustrating a semiconductor light-emitting device according to an exemplary embodiment.

The exemplary embodiments will now be described more fully with reference to the accompanying drawings, in which exemplary embodiments are shown. In the drawings, the same reference numerals denote the same element and repeated explanations are omitted for brevity.

Hereinafter, the exemplary embodiments will be described more fully with reference to the accompanying drawings. The exemplary embodiments may, however, be embodied in many different forms and should not be construed as being limited to the exemplary embodiments set forth herein; rather these exemplary embodiments are provided so that this disclosure will be thorough and complete, and will fully convey the inventive concepts of this disclosure to one of ordinary skill in the art.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of exemplary embodiments. For example, a first element may be referred to as a second element, and likewise, a second element may be referred to as a first element without departing from the scope of the inventive concept.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein by the inventive concept.

A specific process order may be changed in another exemplary embodiment. For example, two processes which are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view illustrating a semiconductor light-emitting device 100 according to an exemplary embodiment.

Referring to FIG. 1, the semiconductor light-emitting device 100 includes a substrate 102, a semiconductor region 120 including a light-emitting structure 110 that is formed on the substrate 102, and a first electrode layer 130 and a second electrode layer 140 that are formed on the semiconductor region 120. A part of the semiconductor region 120 is covered by a first insulating film 122. The first insulating film 122 may be formed of an oxide, a nitride, an insulating polymer, or a combination of these. The first electrode layer 130 and the second electrode layer 140 cover a portion of the semiconductor region 120 not covered by the first insulating film 122.

The substrate 102 may be a transparent substrate. For example, the substrate 102 may be formed of sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$).

The light-emitting structure 110 includes a first semiconductor layer 112, an active layer 114 that is formed on the first semiconductor layer 112, and a second semiconductor layer 116 that is formed on the active layer 114. Each of the first semiconductor layer 112, the active layer 114, and the second semiconductor layer 116 may be formed of a gallium nitride-based compound semiconductor having a composition represented by $In_xAl_yGa_{(1-x-y)}N$ ($0 \leq x \leq 1$, $0 \leq y \leq 1$, and $0 \leq x+y \leq 1$).

In an exemplary embodiment, the first semiconductor layer 112 may be an n-type GaN layer that supplies electrons to the active layer 114 according to power supply. The n-type GaN layer may include group IV elements as n-type impurities. Examples of the group IV elements may include silicon (Si), germanium (Ge), and tin (Sn).

In an exemplary embodiment, the second semiconductor layer 116 may be a p-type GaN layer that supplies holes to the active layer 120 according to power supply. The p-type GaN layer may include group II elements as p-type impurities. In an embodiment, examples of the group II elements may include magnesium (Mg), zinc (Zn), and beryllium (Be).

The active layer 114 emits light having predetermined energy due to recombination between electrons and holes. The active layer 114 may have a stacked structure, in which a quantum well layer and a quantum barrier layer are alternately stacked at least one time. The quantum well layer may have a single quantum well structure or a multi-quantum well structure. In an exemplary embodiment, the active layer 114 may be formed of u-AlGaN. Alternatively, the active layer 114 may have a multi-quantum well structure formed of GaN/AlGaN, InAlGaN/InAlGaN, or InGaN/AlGaN. To improve light-emitting efficiency of the active layer 114, a depth of a quantum well, the number of quantum well layers and quantum barrier layers, which are stacked as pairs, and a thickness of the active layer 114 may be changed.

In an exemplary embodiment, the light-emitting structure 110 may be formed by using metal-organic chemical vapor deposition (MOCVD), hydride vapor phase epitaxy (HVPE), or molecular beam epitaxy (MBE).

The semiconductor region 120 further includes a nitride semiconductor thin film 104 that is disposed between the substrate 102 and the light-emitting structure 110. The nitride semiconductor thin film 104 may function as a buffer layer for reducing a lattice mismatch between the substrate 102 and the first semiconductor layer 112. The nitride semiconductor thin film 104 may be formed of a gallium nitride-based compound semiconductor having a composition represented by $In_xAl_yGa_{(1-x-y)}N$ ($0 \le x \le 1$, $0 \le y \le 1$, and $0 \le x+y \le 1$). In an exemplary embodiment, the nitride semiconductor thin film 104 may be formed of GaN or AlN. Alternatively, the nitride semiconductor thin film 104 may include AlGaN/AlN superlattice layers. Alternatively, the nitride semiconductor thin film 104 may be omitted.

The first electrode layer 130 is formed on the first semiconductor layer 112. The first electrode layer 130 may have a monolayer structure formed of a material selected from the group consisting of nickel (Ni), aluminum (Al), gold (Au), titanium (Ti), chromium (Cr), silver (Ag), palladium (Pd), copper (Cu), platinum (Pt), tin (Sn), tungsten (W), rhodium (Rh), iridium (Ir), ruthenium (Ru), magnesium (Mg), and zinc (Zn), and an alloy including at least one of these, or a multilayer structure formed of a combination of these. In an exemplary embodiment, the first electrode layer 130 may have an Al/Ti/Pt stacked structure.

The second electrode layer 140 is formed on the second semiconductor layer 116. The second electrode layer 140 directly contacts the second semiconductor layer 116. However, the present exemplary embodiment is not limited thereto. In an exemplary embodiment, another semiconductor layer (not shown) may be further disposed between the second semiconductor layer 116 and the second electrode layer 140.

The second electrode layer 140 may function to reflect light emitted from the active layer 114. The second electrode layer 140 may be formed of a metal or an alloy having a high reflectance in a wavelength region of the light emitted from the active layer 114. In an exemplary embodiment, the second electrode layer 140 includes Ag, Al, a combination or an alloy of Ag and Al. In this regard, the Al alloy may include Al and a metal having a work function higher than that of Al. Alternatively, the second electrode layer 140 may be formed of Al, at least one metal selected from the group consisting of Ni, Au, Ag, Ti, Cr, Pd, Cu, Pt, Sn, W, Rh, Ir, Ru, Mg, and Zn, or an alloy including at least one metal.

Alternatively, the second electrode layer 140 may include a metal layer that has both ohmic characteristics and light-reflecting characteristics. Alternatively, the second electrode layer 140 may have a multilayer structure in which a first metal film (not shown) having ohmic characteristics and a second metal film (not shown) having light-reflecting characteristics are stacked. The first metal film may be formed of Pt, Pd, Ni, Au, Ti, or an alloy including at least one of Pt, Pd, Ni, Au, and Ti, or a multilayer metal film. The second metal film may be formed of Ag, Al, or an alloy or a multilayer metal film including at least one of Ag and Al. For example, the second electrode layer 140 may have, but is not limited to, an Ag/Ni/Ti stacked structure or a Ni/Ag/Pt/Ti/Pt stacked structure.

The semiconductor light-emitting device 100 includes a reflective protection structure 150 surrounding an edge portion of the second electrode layer 140. The reflective protection structure 150 extends from an upper surface 140T of the second electrode layer 140 to an upper surface 120T of the semiconductor region 120. In FIG. 1, an upper surface of the second semiconductor layer 116 constitutes the upper surface 120T of the semiconductor region 120. However, the exemplary embodiment is not limited thereto. For example, the semiconductor region 120 may further include an additional semiconductor layer (not shown) that covers the second semiconductor layer 116. In this case, the upper surface 120T of the semiconductor region 120 may be an upper surface of the additional semiconductor layer.

At least one first hole 150H that exposes the upper surface 140T of the second electrode layer 140 is formed in the reflective protection structure 150. Although the cross-sectional view of FIG. 1 exemplarily shows the one first hole 150H, the reflective protection structure 150 may include a plurality of first holes 150H in a plan view of the semiconductor light-emitting device 100.

The reflective protection structure 150 is covered by a second insulating film 160. The second insulating film 160 extends to cover a part of the second electrode layer 14, the reflective protection structure 150, and the first insulating film 122 on the semiconductor region 120. A second hole 160H2 through which the upper surface 140T of the second electrode layer 140 is exposed and communicated with at least one first hole 150H formed in the formed in the reflective protection structure 150 is formed in the second insulating film 160. A third hole 160H3 through which an upper surface 130T of the first electrode layer 130 is exposed is further formed in the second insulating film 160. Although the cross-sectional view of FIG. 1 exemplarily shows the one second hole 160H2 and one third hole 160H3, there may be included a plurality of second holes 160H2 and a plurality of third holes 160H3 in a plan view of the semiconductor light-emitting device 100.

The second insulating film 160 may be formed of an oxide, a nitride, an insulating polymer, or a combination of the oxide, the nitride, and the insulating polymer. In an exemplary embodiment, the second insulating film 160 may be formed of material that is the same as that of the first insulating film 122, or a different from that of the reflective protection structure 150. For example, the first insulating film 122 and the second insulating film 160 may be silicon oxide films, and the reflective protection structure 150 may be an insulating film having a different type from that of the silicon oxide film. Alternatively, the reflective protection structure 150 and the second insulating film 160 may be formed of the same material.

The semiconductor light-emitting device 100 includes a first bonding conductive layer 172 that is connected to the first electrode layer 130, and a second bonding conductive layer 174 that is connected to the second electrode layer 140. Each of the first bonding conductive layer 172 and the second bonding conductive layer 174 may function as an external terminal of the semiconductor light-emitting device 100. The first bonding conductive layer 172 contacts the upper surface 130T of the first electrode layer 130 through the (at least one) third hole 160H3 formed in the second insulating film 160. The second bonding conductive layer 174 contacts the upper surface 140T of the second electrode layer 140 through the (at least one) second hole 160H2 formed in the second insulating film 160 and the (at least one) first hole 150H formed in the reflective protection structure 150. The second bonding conductive layer 174 includes a part surrounded by the reflective protection structure 150, a part surrounded by the second insulating film 160, and a part that covers an upper surface of the second insulating film 160.

The first bonding conductive layer 172 and the second bonding conductive layer 174.

Each of the first bonding conductive layer 172 and the second bonding conductive layer 174 may have a monolayer structure formed of a material selected from the group consisting of Au, Sn, Ni, Pb, Ag, In, Cr, Ge, Si, Ti, W, Pt, and an alloy including at least two of these, or a multilayer structure formed of a combination of these. In an exemplary embodiment, each of the first bonding conductive layer 172 and the second bonding conductive layer 174 may include a Au—Sn alloy, a Ni—Sn alloy, a Ni—Au—Sn alloy, a Pb—Ag—In alloy, a Pb—Ag—Sn alloy, a Pb—Sn alloy, a Au—Ge alloy, or a Au—Si alloy.

When each of the first bonding conductive layer 172 and the second bonding conductive layer 174 has a multilayer structure, each of the first bonding conductive layer 172 and the second bonding conductive layer 174 may include at least two layers selected from the group consisting of a conductive barrier layer (not shown), a conductive adhesive layer (not shown), a conductive coupling layer (not shown), and a conductive bonding layer (not shown). The conductive barrier layer may include at least one selected from the group consisting of a Ti layer, at least one pair of Ti/Pt double layer, at least one pair of Ti/W double layer, at least one pair of TiN/W double layer, at least one pair of W/TiW double layer, and a Ni layer. The conductive adhesive layer may be formed of Ti. The conductive coupling layer may be formed between the conductive adhesive layer and the conductive bonding layer, and may be formed of Ni or Ni/Au. The conductive bonding layer may include an Au—Sn alloy, a Ni—Sn alloy, a Ni—Au—Sn alloy, a Pb—Ag—In alloy, a Pb—Ag—Sn alloy, a Pb—Sn alloy, an Au—Ge alloy, or an Au—Si alloy. Structures of the first bonding conductive layer 172 and the second bonding conductive layer 174 are not limited thereto, and each of the first bonding conductive layer 172 and the second bonding conductive layer 174 may be formed of a combination of various other conductive materials.

The reflective protection structure 150 surrounds an interface between the semiconductor region 120 and the second electrode layer 140 and a side wall 140S of the second electrode layer 140 around an edge of the interface. Although the side wall 140S of the second electrode layer 140 is perpendicular to a direction in which a main surface of the substrate 102 extends in FIG. 1, the present exemplary embodiment is not limited thereto. In an exemplary embodiment, the side wall 140S of the second electrode layer 140 may be an inclined surface. Likewise, although a side wall of the first electrode layer 130 is also exemplarily perpendicular to the direction in which the main surface of the substrate 102 extends, the present exemplary embodiment is not limited thereto. The side wall of the first electrode layer 130 may be the inclined surface.

The reflective protection structure 150 includes a reflection region 150R covering the semiconductor region 120 around the second electrode layer 140. In an exemplary embodiment, the reflective protection structure 150 may partially or wholly cover a part of the upper surface of the second electrode layer 116 that is exposed between the first insulating film 122 and the second electrode layer 140.

The reflective protection structure 150 may be formed of a material for reflecting light generated from the active layer 114 and emitted toward around the second electrode layer 140 through the second semiconductor layer 116. For example, the reflective protection structure 150 may be formed of an oxide, a nitride, an oxynitride, metal, an alloy, or a combination of the above.

In an exemplary embodiment, the reflective protection structure 150 may be formed of an insulating material having a refractive index of a semiconductor layer of the semiconductor region 120 contacting the second electrode layer 140, i.e., a refractive index smaller than that of the second semiconductor layer 116 in FIG. 1. In this case, at least a part of the light generated in the active layer 114 and emitted toward around the second electrode layer 140 is totally reflected in the reflection region 150R of the reflective protection structure 150, thereby contributing to improvement of light extraction efficiency. In an exemplary embodiment, although the reflective protection structure 150 may be formed of a silicon oxide, a silicon nitride, a silicon oxynitride, a titanium oxide, a tantalum oxide, a hafnium oxide, a zinc oxide, a zirconium oxide, an aluminum oxide, an aluminum nitride, or a niobium oxide, the present embodiment is not limited thereto. For example, the reflective protection structure 150 may include a monolayer film formed of $SiO_2$, $Si_3N_4$, $SiO_xN_y$ (x+y≤2, x>0, y>0), $TiO_2$, $Ti_3O_5$, $Ti_2O_3$, TiO, $Ta_2O_5$, $HfO_2$, ZnO, $ZrO_2$, $Al_2O_3$, AlN, or $Nb_2O_5$ or a multilayer film formed of at least two different materials selected from the above.

For example, when the second semiconductor layer 116 is formed of p-GaN, the reflective protection structure 150 may be formed of a $SiO_2$, $Ta_2O_5$, $HfO_2$, $Si_3N_4$, $SiO_xN_y$ film (x+y≤2, x>0, y>0). At a wavelength of 450 nm, the $SiO_2$, $Ta_2O_5$, $HfO_2$, $Si_3N_4$ films may have a refractive index of about 1.55, about 1.83, about 1.96, and about 2.05, respectively. The $SiO_xN_y$ film may have a refractive index in the range of about 1.49 and about 1.92 at the wavelength of 450 nm according to a content of nitrogen (N). The refractive index of the $SiO_xN_y$ film may be lower according to a reduction in the content of nitrogen (N).

The reflective protection structure 150 may have a total reflection structure formed of a monolayer insulating film, a metallic reflector film, a distributed Bragg reflector (DBR) structure, an omni-directional reflector (ODR), or a combination of the above. This will be described later with reference to FIGS. 2A through 2E.

The semiconductor light-emitting device 100 includes the reflective protection structure 150 surrounding the edge portion of the second electrode layer 140 to cover a part of the upper surface 140T of the second electrode layer 140, the sidewall 140S of the second electrode layer 140, and the second electrode layer 116 around the second electrode layer 140, thereby physically reinforcing an adhesion force between the second electrode layer 140 and the second semiconductor layer 116. The interface between the second electrode layer 140 and the second semiconductor layer 116 is surrounded by the reflective protection structure 150 near the edge of the interface, thereby inhibiting a leakage current from being generated through the interface between the second electrode layer 140 and the second semiconductor layer 116 and preventing an external physical shock and physical damage due to the external physical shock and an external chemical penetration.

For example, when the sidewall and the upper surface of the second electrode layer 140 are completely surrounded by a conductive protection film (not shown), in particular, a metal protection film, stress of the metal protection film may be increased due to a crystalline growth characteristic of metal. As a result, residual stress of the metal protection film spreads to an adjacent thin film, which may cause a problem of damage or cracking of the second electrode layer 140 provided in a lower portion of the metal protection film. When the sidewall and the upper surface of the second electrode layer 140 are completely surrounded by the conductive protection film, the leakage current may be generated due to a mechanical shock at a part of an edge portion of the conductive protection film that contacts the upper surface of the second electrode layer 116, and a structure problem that is vulnerable to a chemical penetration from an external environment may occur.

However, the (at least one) first hole 150H that partially exposes the upper surface of the second electrode layer 140 is formed in the reflective protection structure 150 of the semiconductor light-emitting device 100 according to an exemplary embodiment. Thus, compared to the case where the reflective protection structure 150 completely surrounds the sidewall and the upper surface of the second electrode layer 140, additional residual stress of the reflective protection structure 150 is relaxed by the (at least one) first hole 150H, thereby inhibiting the additional residual stress from spreading to the second electrode layer 140 due to the reflective protection structure 150 and obtaining a more stable electrode structure. A portion of the reflective protection structure 150 that contacts the second electrode layer 140 and the second semiconductor layer 116 is formed of an insulating film, and thus the mechanical shock at the part of the edge portion of the reflective protection structure 150 that contacts the upper surface of the second electrode layer 116 is relaxed, thereby inhibiting the leakage current and the chemical penetration from the external environment, and obtaining a relatively stable structure.

The reflective protection structure 150 is formed of a material for increasing light reflection efficiency, thereby further contributing to improvement of the light reflection efficiency as much as a part of the reflective protection structure 150 covering the second semiconductor layer 116 around the second electrode layer 140. That is, at least a part of light generated in the active layer 114 and emitted toward around the second electrode layer 140 is reflected in the reflection region 150R of the reflective protection structure 150, and thus minimizing an amount of light which does not travel in a desired direction from the active layer 114 and is substantially lost, thereby maximizing substantial light extraction efficiency.

Next, semiconductor light-emitting devices 100A, 100B, 100C, 100D, and 100E according to exemplary embodiments will now be described with reference to FIGS. 2A through 2E. The semiconductor light-emitting devices 100A, 100B, 100C, 100D, and 100E of FIGS. 2A through 2E, respectively, include reflective protection structures 150A, 150B, 150C, 150D, and 150E according to various modifications of the reflective protection structure 150 of FIG. 1. The same reference numerals between FIGS. 2A through 2E and FIG. 1 denote the same elements, and detailed descriptions thereof are omitted here to avoid redundant explanations. The reflective protection structures 150A, 150B, 150C, 150D, and 150E and some related elements are only shown in FIGS. 2A through 2E. Other well-known elements that are not shown in FIGS. 2A through 2E are generally the same as described above with reference to FIG. 1.

Figure 2A:
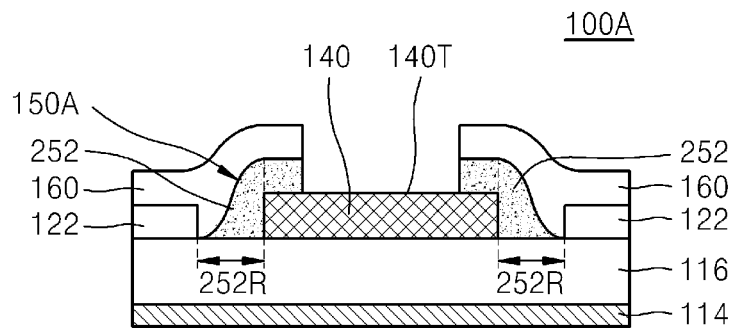
FIGS. 2A through 2E are cross-sectional views illustrating semiconductor light-emitting devices according to an exemplary embodiment.

Referring to FIG. 2A, the reflective protection structure 150A of the semiconductor light-emitting device 100A includes a total reflective structure 252 formed of a monolayer insulating thin film. In an exemplary embodiment, the total reflective structure 252 may totally reflect at least a part of light generated in the active layer 114 and emitted toward around the second electrode layer 140 in a reflection region 252R of the total reflective structure 252.

The total reflective structure 252 may be formed of an insulating structure of a monolayer structure having a refractive index smaller than that of the second semiconductor layer 116. In an exemplary embodiment, the insulating structure of the total reflective structure 252 may be formed of a silicon oxide, a silicon nitride, a silicon oxynitride, a titanium oxide, a tantalum oxide, a hafnium oxide, a zinc oxide, a zirconium oxide, an aluminum oxide, an aluminum nitride, or a niobium oxide.

In an exemplary embodiment, the total reflective structure 252 may be formed of the same material as the second insulating film 160. Alternatively, the total reflective structure 252 may be formed of a different material from the second insulating film 160.

Figure 2B:
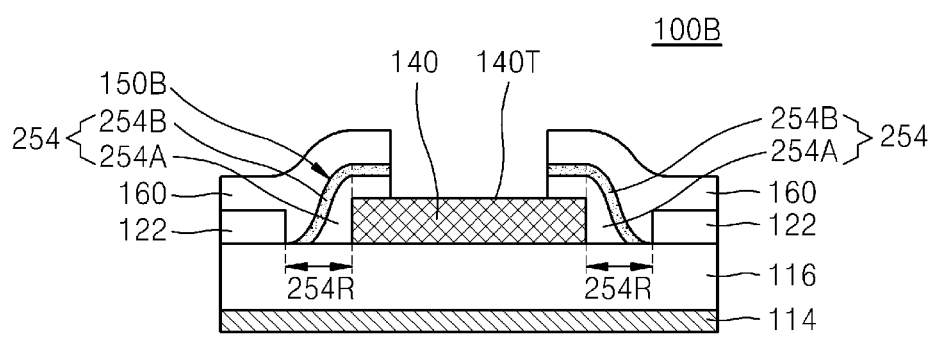

Referring to FIG. 2B, the reflective protection structure 150B of the semiconductor light-emitting device 100B includes a total reflective structure 254 formed of an insulating thin film of a multilayer structure. The total reflective structure 254 includes a plurality of insulating thin films 254A and 254B formed of different materials. The plurality of insulating thin films 254A and 254B include the first insulating thin film 254A and the second insulating thin film 254B. A refractive index of each of the first insulating thin film 254A and the second insulating thin film 254B may be smaller than that of the second semiconductor layer 116. The first insulating thin film 254A and the second insulating thin film 254B may have different refractive indices. In an exemplary embodiment, the refractive index of the first insulating thin film 254A may be smaller than that of the second insulating thin film 254B.

In an exemplary embodiment, the total reflective structure 254 may totally reflect at least a part of light generated in the active layer 114 and emitted toward around the second electrode layer 140 in a reflection region 254R of the total reflective structure 254. FIG. 2B exemplarily shows the total reflective structure 254 having a double film structure including the first insulating thin film 254A and the second insulating thin film 254B. However, the present exemplary embodiment is not limited thereto. For example, the total reflective structure 254 may have a multilayer film structure in which at least three insulating thin films are sequentially stacked.

In an exemplary embodiment, the first insulating thin film 254A and the second insulating thin film 254B may be formed of different materials selected from the group consisting of a silicon oxide, a silicon nitride, a silicon oxynitride, a titanium oxide, a tantalum oxide, a hafnium oxide, a zinc oxide, a zirconium oxide, an aluminum oxide, an aluminum nitride, or a niobium oxide.

In an exemplary embodiment, the first insulating thin film 254A may be formed of the same material as the second insulating film 160, and the second insulating thin film 254B may be formed of a different material from the second insulating film 160.

Figure 2C:
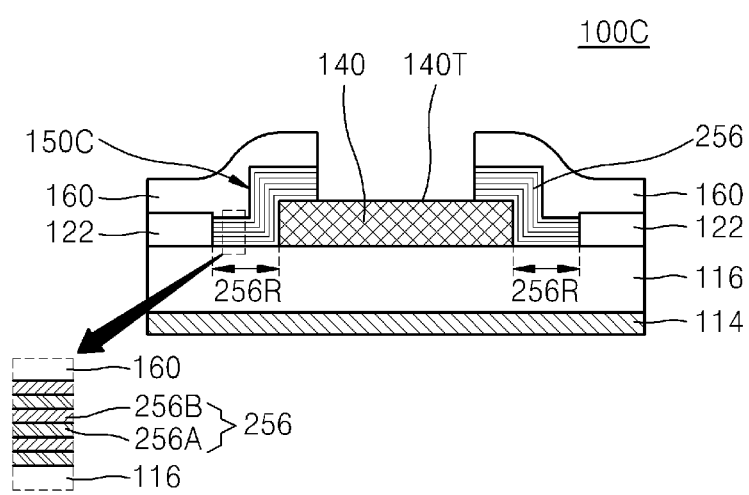

Referring to FIG. 2C, the reflective protection structure 150C of the semiconductor light-emitting device 100C includes a Distributed Bragg Reflector (DBR) structure 256.

In an exemplary embodiment, the DBR structure 256 may totally reflect at least a part of light generated in the active layer 114 and emitted toward around the second electrode layer 140 in a reflection region 256R of the total reflective structure 256.

In an exemplary embodiment, the DBR structure 256 includes a multi-reflective layer formed of an insulating structure in which a first layer 256A having a first refractive index and a second layer 256B having a second refractive index smaller than the first refractive index are alternately stacked at least one time. Each of the first layer 256A and the second layer 256B may be formed of any one oxide or nitride selected from the group consisting of Si, Zr, Ta, Ti, Hf, and Al. In an exemplary embodiment, the first layer 256A and the second layer 256B may be formed of different materials selected from the group consisting of $SiO_x$ (0<x≤2), $TiO_2$, $Ti_3O_5$, $Ti_2O_3$, TiO, $Ta_2O_5$, $ZrO_2$, $Nb_2O_5$, $CeO_2$, ZnS, $Al_2O_3$, SiN, siloxane polymers, and $MgF_2$. For example, the first layer 256A may be formed of any one material selected from the group consisting of SiN, AlN, $TiO_2$, and $SiO_x$ (0<x<2), and the second layer 256B may be formed of any one material of $SiO_2$ and $Al_2O_3$. Although the first layer 256A exemplarily contacts the second semiconductor layer 116 in FIG. 2C, the present exemplary embodiment is not limited thereto. Alternatively, locations of the first layer 256A and the second layer 256B may be switched each other. Each of the first layer 256A and the second layer 256B may have a thickness ¼ a wavelength λ of light generated in the active layer 114.

Figure 2D:
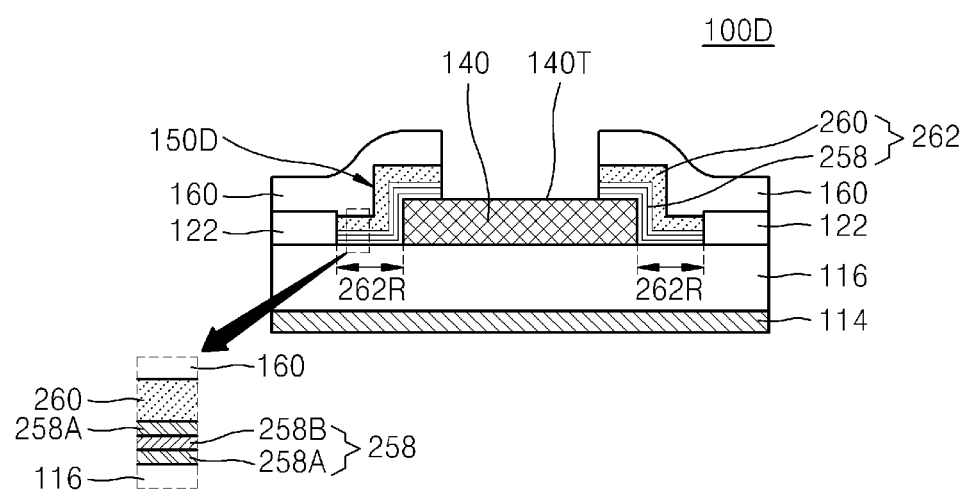

Referring to FIG. 2D, the reflective protection structure 150D of the semiconductor light-emitting device 100D includes a DBR structure 258 and a hybrid reflective structure 262 including a metallic reflector film 260 covering the DBR structure 258. The metallic reflector film 260 is spaced apart from the second electrode layer 140 having the DBR structure 258 disposed therebetween.

In an exemplary embodiment, the hybrid reflective structure 262 may totally reflect at least a part of light generated in the active layer 114 and emitted toward around the second electrode layer 140 in a reflection region 262R of the total reflective structure 262.

Similarly to the DBR structure 256 described with reference to FIG. 2C, the DBR structure 258 includes a multi-reflective layer formed of an insulating structure in which a first layer 258A having a first refractive index and a second layer 258B, having a second refractive index smaller than the first refractive index, are stacked at least one time. The first layer 258A and the second layer 258B are the same as the first layer 256A and the second layer 256B described with reference to FIG. 2C above.

In an exemplary embodiment, the metallic reflector film 260 may be formed of Ag, Al, Ni, Cr, Pd, Cu, Pt, Sn, W, Au, Rh, Ir, Ru, Mg, Zn, Ti, or an alloy including at least one of these. For example, the metallic reflector film 260 may be a monolayer film formed of one of the above-listed materials or may be formed of an alloy including at least two types of metals such as Ni/Ag, Zn/Ag, Ni/Al, Zn/Al, Pd/Ag, Pd/Al, Ir/Ag. Ir/Au, Pt/Ag, Pt/Al, Ni/Ag/Pt, Ni/Ag/Mg.

Figure 2E:
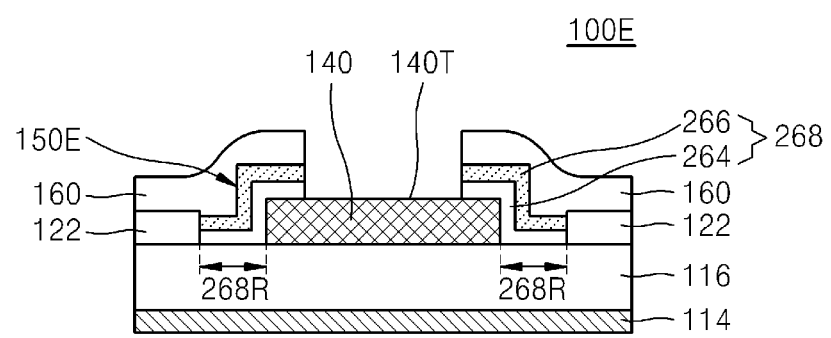

Referring to FIG. 2E, the reflective protection structure 150E of the semiconductor light-emitting device 100E includes an insulating thin film 264 having a refractive index smaller than that of the second electrode layer 116 and an Omni-Directional Reflector (ODR) structure 268 having a metallic reflector film 266 covering the insulating thin film 264. The metallic reflector film 266 is spaced apart from the second electrode layer 140 having the insulating thin film 264 disposed therebetween.

In an exemplary embodiment, the ODR structure 268 may totally reflect at least a part of light generated in the active layer 114 and emitted toward around the second electrode layer 140 in a reflection region 268R of the ODR structure 268.

In an exemplary embodiment, the insulating thin film 264 of the ODR structure 268 may be formed of $SiO_x$ ($0<x\leq2$), $TiO_2$, $Ti_3O_5$, $Ti_2O_3$, TiO, $Ta_2O_5$, $ZrO_2$, $Nb_2O_5$, $CeO_2$, ZnS, $Al_2O_3$, SiN, siloxane polymers, or $MgF_2$. The metallic reflector film 266 may be formed of Ag, Al, Ni, Cr, Pd, Cu, Pt, Sn, W, Au, Rh, Ir, Ru, Mg, Zn, Ti, or an alloy including at least one of these. For example, the metallic reflector film 266 may be a monolayer film formed of one of the above-listed materials or may be formed of an alloy including at least two types of metals such as Ni/Ag, Zn/Ag, Ni/Al, Zn/Al, Pd/Ag, Pd/Al, Ir/Ag. Ir/Au, Pt/Ag, Pt/Al, Ni/Ag/Pt, Ni/Ag/Mg.

FIGS. 3A through 3G are cross-sectional views for explaining a method of manufacturing the semiconductor light-emitting device 100 of FIG. 1 according to an exemplary embodiment. The same reference numerals of FIGS. 3A through 3G and FIG. 1 denote the same elements, and detailed descriptions thereof will not be given for brevity of explanation.

Figure 3A:
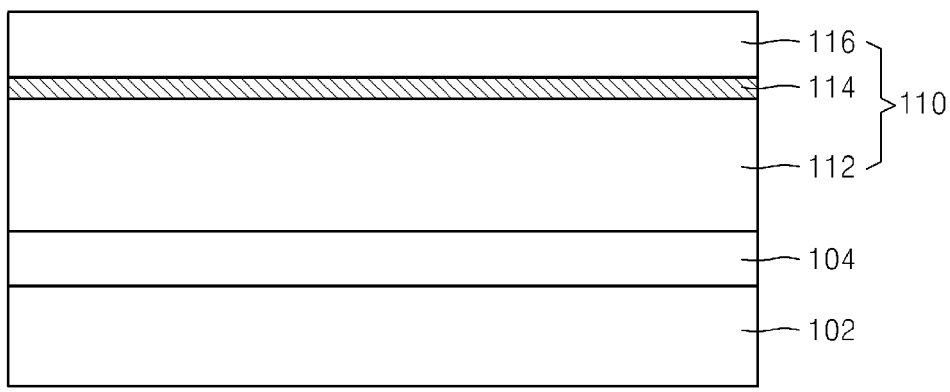
FIGS. 3A through 3G are cross-sectional views for explaining a method of manufacturing a semiconductor light-emitting device according to an exemplary embodiment.

Referring to FIG. 3A, the nitride semiconductor thin film 104 and the light-emitting structure 110 including the first semiconductor layer 112, the active layer 114, and the second semiconductor layer 116 are formed on the substrate 102.

In an exemplary embodiment, the light-emitting structure 110 may be formed by using MOCVD, HVPE, or MBE.

Figure 3B:
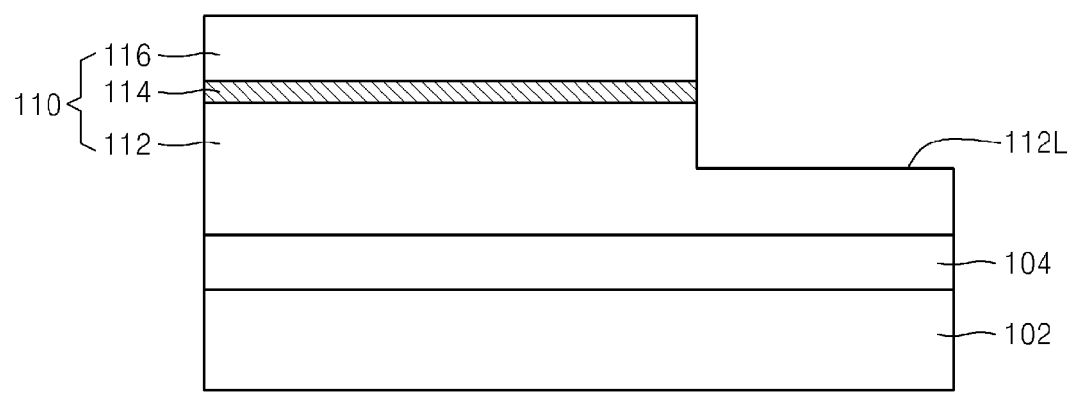

Referring to FIG. 3B, a low surface portion 112L of the first semiconductor layer 112 is formed by mesa-etching a part of the light-emitting structure 110 to a predetermined depth of the first semiconductor layer 112 from the second semiconductor layer 116.

The mesa-etching of the light-emitting structure 140 may be performed by using reactive ion etching (RIE).

Figure 3C:
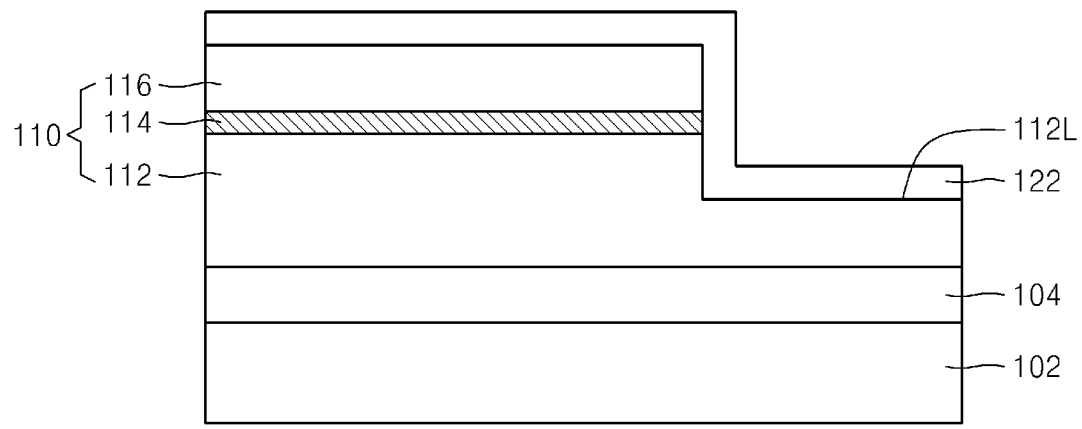

Referring to FIG. 3C, the first insulating film 122 that covers an exposed surface of the low surface portion 112L of the first semiconductor layer 112, and the light-emitting structure 110 is formed.

The first insulating film 122 may be formed of, but is not limited to, a silicon oxide film, a silicon nitride film, an insulating polymer, or a combination thereof. In an exemplary embodiment, the first insulating film 122 may be formed by using PECVD, PVD, or spin coating.

Figure 3D:
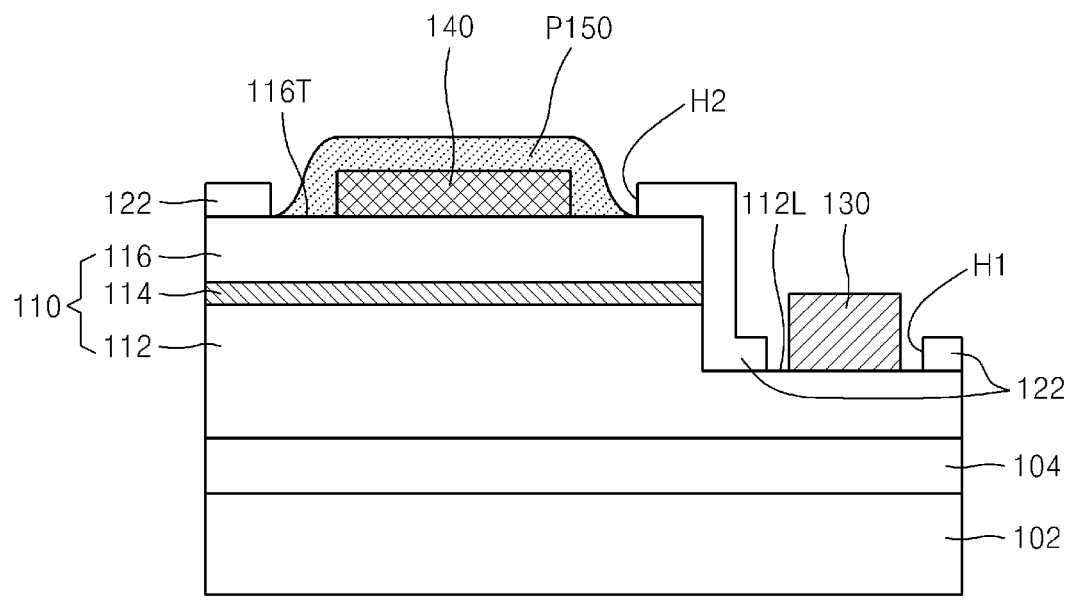

Referring to FIG. 3D, a hole H1 is formed, through which the lower surface portion 112L of the first semiconductor layer 112 is exposed, by etching a part of the first insulating film 122, and the first electrode layer 130 that is connected to the first semiconductor layer 112 through the hole H1 is formed.

Next, a hole H2 is formed, through which an upper surface 116T of the second semiconductor layer 116 is exposed, by etching another part of the first insulating film 122, and then the second electrode layer 140 that is connected to the second semiconductor layer 116 through the hole H2 is formed. Thereafter, a reflective protection layer P150 is formed, covering the second electrode layer 140 and the upper surface 116T of the second semiconductor layer 116 exposed around the second electrode layer 140.

The reflective protection layer P150 is a preparatory film for forming the reflective protection structure 150 of FIG. 1, and, as shown in FIGS. 2A through 2E, may be formed as a preparatory film for forming the total reflective structure 252 formed of a monolayer insulating thin film, the total reflective structure 254 formed of a plurality of insulating thin films, the DBR structure 256, the hybrid reflective structure 262, or the ODR structure 268.

In an exemplary embodiment, the holes H1 and H2 may be formed in the first insulating film 122 by using RIE or wet etching using a buffered oxide etchant (BOE).

In an exemplary embodiment, the first electrode layer 130 and the second electrode layer 140 may be formed by using directed vapor deposition (DVD) using electron beam evaporation. In an exemplary embodiment, the reflective protection layer P150 may be formed by using sputtering.

Although the first electrode layer 130 is formed and then the second electrode layer 140 and the reflective protection layer P150 are formed in the present exemplary embodiment, an order in which the first electrode layer 130, the second electrode layer 140, and the reflective protection layer P150 are formed is not limited thereto. For example, the second electrode layer 140 may be first formed and then the first electrode layer 130 may be formed. Alternatively, the first electrode layer 130 may be formed after the second electrode layer 140 and the reflective protection layer P150 are formed.

Figure 3E:
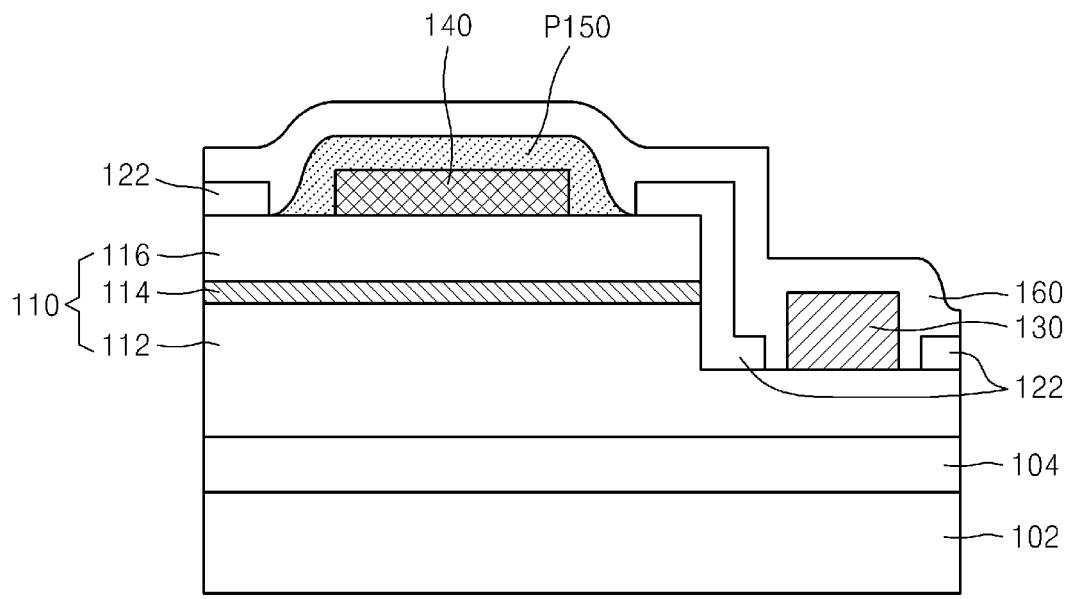

Referring to FIG. 3E, the second insulating film 160 that covers the first insulating film 122, the first electrode layer 130, and the reflective protection layer P150 is formed.

The second insulating film 160 may be formed of, but is not limited to, a silicon oxide film, a silicon nitride film, an insulating polymer, or a combination of these. In an exemplary embodiment, the second insulating film 160 may be formed by using PECVD, PVD, or spin coating.

Figure 3F:
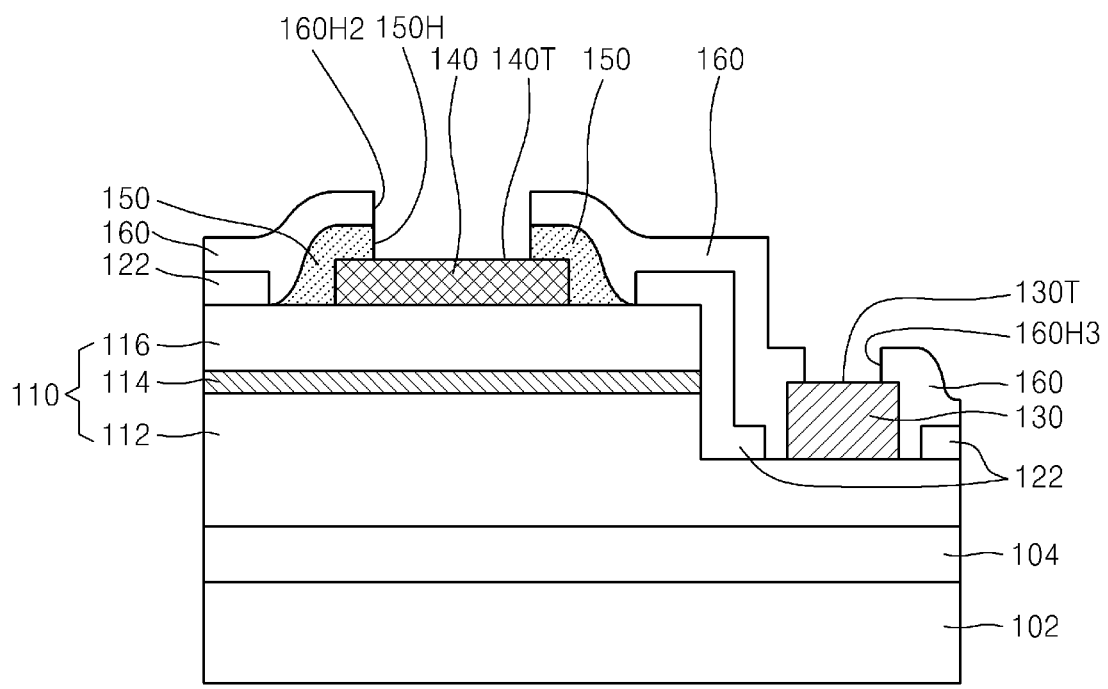

Referring to FIG. 3F, the upper surface 130T of the first electrode layer 130 and the upper surface 140T of the second electrode layer 140 are exposed by etching a part of the second insulating film 160 and the reflective protection layer P150.

In an exemplary embodiment, to expose the upper surface 130T of the first electrode layer 130 and the upper surface 140T of the second electrode layer 140, a mask pattern (not shown), in which a plurality of holes through which a part of the second insulating film 160 is exposed are formed, may be formed on the second insulating film 160. The second insulating film 160 and the reflective protection layer P150 may be etched by using the mask pattern as an etch mask. Next, the second insulating film 160 may be exposed by removing the mask pattern used as the etch mask. The second insulating film 160 and the reflective protection layer P150 may be etched by using RIE. However, the present exemplary embodiment is not limited to the above processing, and various modifications and changes may be possible.

As a result of etching the second insulating film 160 and the reflective protection layer P150, the reflective protection structure 150 is obtained, in which the first hole 150H through which the upper surface 140T of the second electrode layer 140 is exposed is formed. A second hole 160H2, through which the upper surface 140T of the second electrode layer 140 is exposed, and a third hole 160H3, through which upper surface 130T of the first electrode layer 130 is exposed, are formed in the second insulating film 160.

Figure 3G:
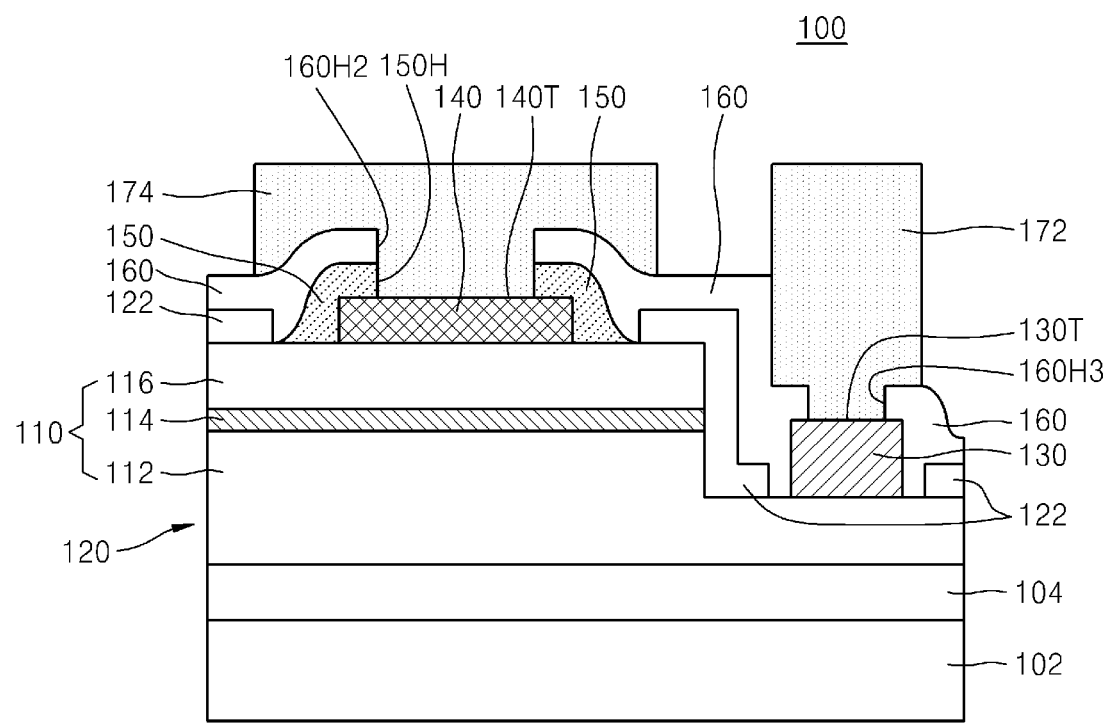

Referring to FIG. 3G, the first bonding conductive layer 172, that is connected to the first electrode layer 130 through the third hole 160H3, and the second bonding conductive layer 174, that is connected to the second electrode layer 140 through the first hole 150H and the second hole 160H2, are formed.

In an exemplary embodiment, the semiconductor light-emitting device 100 manufactured by using the method may be mounted on a package substrate (not shown) by using eutectic bonding by using the first bonding conductive layer 172 and the second bonding conductive layer 174 as bonding layers.

Figure 4A:
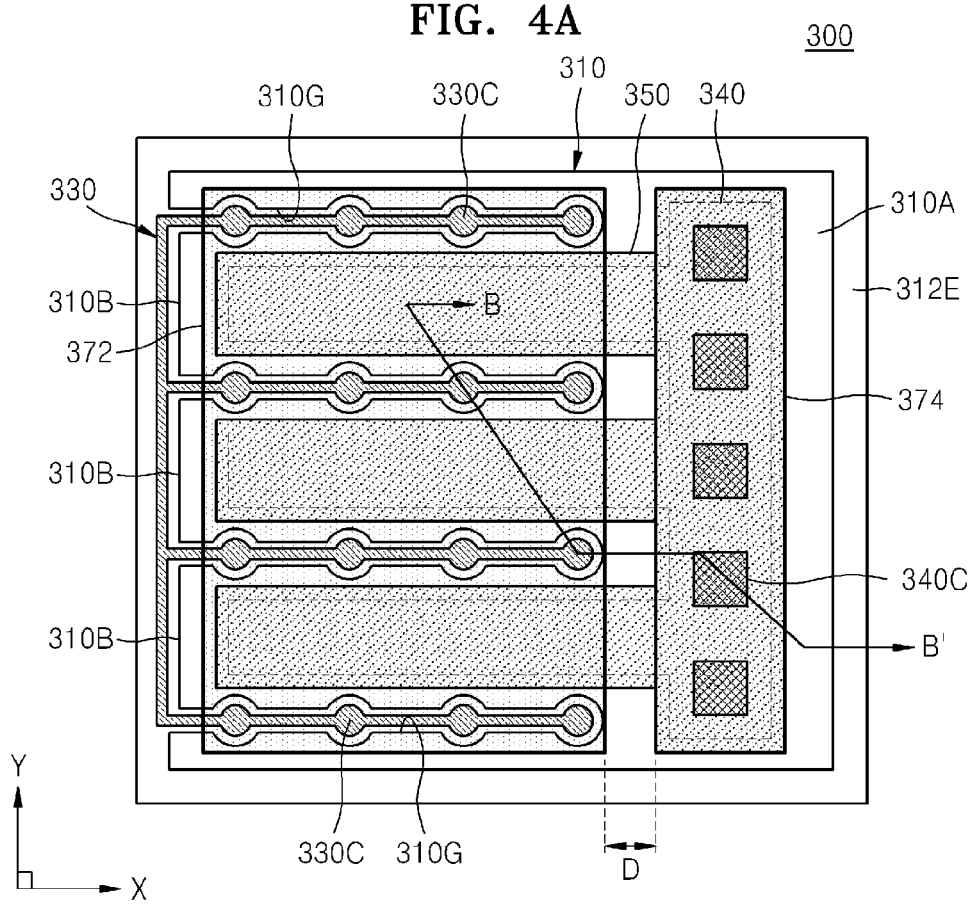
FIG. 4A is a planar layout illustrating elements of a semiconductor light-emitting device according to an exemplary embodiment.
Figure 4B:
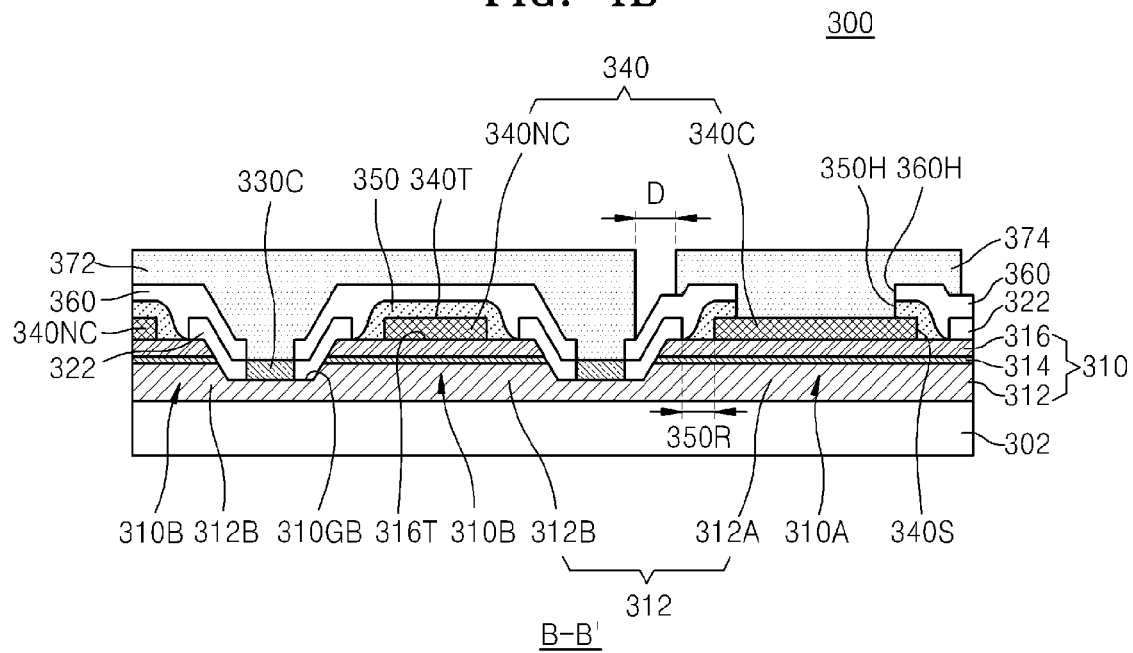
FIG. 4B is a cross-sectional view taken along line 4B-4B' of FIG. 4A.
Figure 4C:
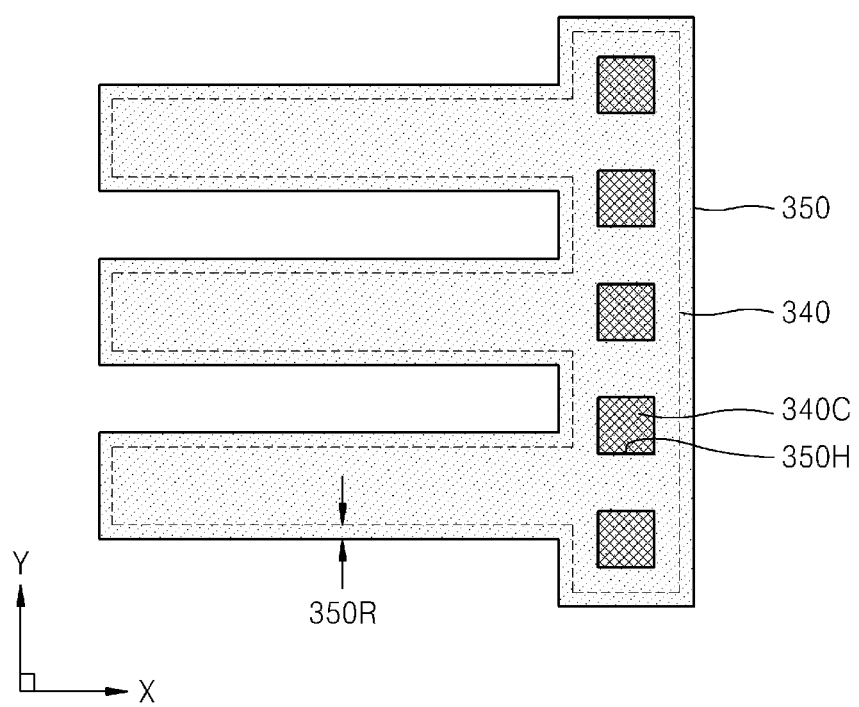
FIG. 4C is a plan view illustrating a second electrode layer and a reflective protection structure of the semiconductor light-emitting device of FIG. 4A.

FIG. 4A is a planar layout illustrating elements of a semiconductor light-emitting device 300 according to an exemplary embodiment. FIG. 4B is a cross-sectional view taken along line 4B-4B' of FIG. 4A. FIG. 4C is a plan view illustrating a second electrode layer 340 and a reflective protection structure 350 of the semiconductor light-emitting device 300 of FIG. 4A.

Exemplary plan shapes of a first electrode layer 330 and the second electrode layer 340 that may be employed by the semiconductor light-emitting device 300 according to an exemplary embodiment and an exemplary plan shape of the reflective protection structure 350 having a shape corresponding to the plan shape of the second electrode layer 340, surrounding an edge portion of the second electrode layer 340, and covering a part of an upper surface of the second electrode layer 340, a sidewall of the second electrode layer 340, and a second semiconductor layer 316 around the second electrode layer 340, will now be described with reference to FIGS. 4A through 4C.

Referring to FIGS. 4A through 4C, the semiconductor light-emitting device 300 includes a substrate 302, and a light-emitting structure 310 that is formed on the substrate 302.

The substrate 302 may have the same structure as that of the substrate 102 of FIG. 1.

Grooves 310G are formed in a portion of the light-emitting structure 310. The light-emitting structure 310 includes a first mesa structure 310A that extends in a first direction (Y direction in FIG. 4A) on the substrate 302, and a plurality of second mesa structures 310B that are spaced apart from one another with the grooves 310B therebetween and are connected to one another through the first mesa structure 310A at one ends thereof.

The light-emitting structure 310 includes a first semiconductor layer 312, an active layer 314, and a second semiconductor layer 316 that are sequentially formed on the substrate 302.

The first semiconductor layer 312 includes first and second mesa regions 312A and 312B having a plurality of branching portions that are spaced apart from one another due to the grooves 310G. That is, the first semiconductor layer 312 includes the first mesa region 312A that constitutes a part of the first mesa structure 310A, and the plurality of second mesa regions 312B that are spaced apart from one another with the grooves 310G therebetween and are connected to one another through the first mesa region 312A at one ends thereof.

A low surface portion 312E of the first semiconductor layer 312 is exposed around the light-emitting structure 310 on an edge portion of the substrate 302. The low surface portion 312E of the first semiconductor layer 312 is on almost the same level as lower surfaces 310GB of the grooves 310G, and is connected to the lower surfaces 310GB of the grooves 310G. The low surface portion 312E of the first semiconductor layer 312 may be used as a scribing line during a subsequent process for separating the substrate 302 in units of chips. In an exemplary embodiment, the first semiconductor layer 312 may not include the low surface portion 312E.

The first semiconductor layer 312 may be formed of an n-type semiconductor, and the second semiconductor layer 316 may be formed of a p-type semiconductor. The first semiconductor layer 312, the active layer 314, and the second semiconductor layer 316 are substantially the same as the first semiconductor layer 112, the active layer 114, and the second semiconductor layer 116 of FIG. 1, and thus detailed explanations thereof will not be given.

A portion of the first semiconductor layer 312 is exposed on the lower surfaces 310GB of the grooves 310G. A first electrode layer 330 is formed on the portion of the first semiconductor layer 312 which is exposed on the lower surfaces 310GB of the grooves 310G. The first electrode layer 330 extends in a longitudinal direction of the grooves 310G. The first electrode layer 330 has a plurality of contact regions 330C that are disposed in the grooves 310G. Although the plurality of contact regions 330C have greater widths than other portions of the first electrode layer 330, the present exemplary embodiment is not limited thereto.

A second electrode layer 340 is formed on the light-emitting structure 310. The second electrode layer 340 is connected to the second semiconductor layer 316.

The second electrode layer 340 is disposed on the light-emitting structure 310 to overlap with the first mesa structure 310A and the plurality of second mesa structures 310B branching from the first mesa structure 310A. A portion of the second electrode layer 340 disposed on the first mesa structure 310A constitutes a contact region 340C, and another portion of the second electrode layer 340 disposed on the plurality of second mesa structures 310B constitutes a non-contact region 340NC.

Detailed descriptions of materials of the first electrode layer 330 and the second electrode layer 340 are generally the same as those of the first electrode layer 130 and the second electrode layer 140 described with reference to FIG. 1 above.

A first insulating film 322 is formed between the first electrode layer 330 and the second electrode layer 340. The first insulating film 322 covers side walls of the first mesa structure 310A and the plurality of second mesa structures 310B branching from the first mesa structure 310A of the light-emitting structure 310.

The reflective protection structure 350 extends from an upper surface 340T of the second electrode layer 340 and the upper surface 316T of the second semiconductor layer 316.

A plurality of first holes 350H, through which the contact region 340C of the upper surface 340T of the second electrode layer 340 is exposed, are formed in the reflective protection structure 350. The plurality of first holes 350H may be arranged in locations spaced apart from each other on a straight line. Planar shapes, arrangement, and number of the plurality of first holes 350H are not limited to those of FIGS. 4A through 4C, and various modifications and changes thereof are possible.

The reflective protection structure 350 is covered by the second insulating film 360. The second insulating film 360 extends to cover a part of the second electrode layer 340, the reflective protection structure 350, and the first insulating film 322 on the second semiconductor layer 316. A plurality of second holes 360H, connected to the plurality of first holes 350H formed in the reflective protection structure 350 and through which the contact region 340C of the second electrode layer 340 is exposed, are formed in the second insulating film 360.

The reflective protection structure 350 surrounds a sidewall 340S of the second electrode layer 340 and an interface between the second semiconductor layer 316 and the second electrode layer 340 around an edge of the interface. Although the sidewall 340S of the second electrode layer 340 is perpendicular to a direction in which a main surface of the substrate 302 extends in FIG. 4B, the present exemplary embodiment is not limited thereto. In an exemplary embodiment, the sidewall 340S of the second electrode layer 340 may be an inclined surface. Likewise, although a sidewall of the contact region 330C of the first electrode layer 330 is also perpendicular to the direction in which the main surface of the substrate 302 extends, the present exemplary embodiment is not limited thereto. The sidewall of the contact region 330C of the first electrode layer 330 may be an inclined surface.

The reflective protection structure 350 includes a reflection region 350R covering the second semiconductor layer 315 around the second electrode layer 340. In an exemplary embodiment, the reflective protection structure 350 may partially or wholly cover a part of the upper surface 316T of the second semiconductor layer 316 that is exposed between the first insulating film 322 and the second electrode layer 340.

The reflective protection structure 350 may be formed of a material for reflecting light generated in the active layer 314 and emitted toward around the second electrode layer 340 through the second semiconductor layer 316. A detailed description of the material of the reflective protection structure 350 is the same as described above with reference to the reflective protection structure 150 of FIG. 1.

The reflective protection structure 350, as shown in FIGS. 2A through 2E, may have a shape of the total reflective structure 252 formed of a monolayer insulating thin film, the total reflective structure 254 formed of a plurality of insulating thin films, the DBR structure 256, the hybrid reflective structure 262, or the ODR structure 268.

The non-contact region 340NC of the second electrode layer 340 is covered by a second insulating film 360. The second insulating film 360 covers a side wall of the light-emitting structure 310 with the first insulating film 322 therebetween.

A first bonding conductive layer 372, that is connected to a plurality of contact regions 330C of the first electrode layer 330, and a second bonding conductive layer 374, that is connected to a contact region 340C of the second electrode layer 340, are formed on the second insulating film 360. The first bonding conductive layer 372 and the second bonding conductive layer 374 are spaced apart from each other by a predetermined interval D.

The first bonding conductive layer 372 contacts the second insulating film 360 and the plurality of contact regions 340C of the first electrode layer 330 on the plurality of second mesa structures 310B, and extends to overlap with the plurality of second mesa structures 310B. The first bonding conductive layer 372 covers the non-contact region 340NC of the second electrode layer 340 with the second insulating film 360 therebetween. The first bonding conductive layer 372 and the non-contact region 340NC of the second electrode layer 340 may be insulated from each other due to the second insulating film 360 that is disposed between the first bonding conductive layer 372 and the non-contact region 340NC of the second electrode layer 340.

The second bonding conductive layer 374 contacts the contact region 340C of the second electrode layer 340 through the plurality of first holes 350H formed in the reflective protection structure 350 and the plurality of second holes 360H formed in the second insulating film 360. The second bonding conductive layer 374 includes a part surrounded by the reflective protection structure 350, a part surrounded by the second insulating film 360, and a part covering an upper surface of the second insulating film 360.

The first bonding conductive layer 372 and the second bonding conductive layer 374 are the same as the first bonding conductive layer 172 and the second bonding conductive layer 174 of FIG. 1.

The semiconductor light-emitting device 300 of FIGS. 4A through 4C may be manufactured by using the method of manufacturing the semiconductor light-emitting device 100 described with reference to FIGS. 3A through 3G. Accordingly, a detailed explanation of a method of manufacturing the semiconductor light-emitting device 300 will not be given.

The semiconductor light-emitting device 300 includes the reflective protection structure 350 surrounding the edge portion of the second electrode layer 340 to cover the part of the upper surface 340T of the second electrode layer 340, the sidewall 340S of the second electrode layer 340, and the second electrode layer 316 around the second electrode layer 340, thereby physically reinforcing an adhesion force between the second electrode layer 340 and the second semiconductor layer 316. The interface between the second electrode layer 340 and the second semiconductor layer 316 is surrounded by the reflective protection structure 350, thereby inhibiting a leakage current from being generated through the interface between the second electrode layer 340 and the second semiconductor layer 316 and preventing an external physical shock and physical damage due to the external physical shock and an external chemical penetration.

The plurality of first holes 350H that partially expose the upper surface of the second electrode layer 340 are formed in the reflective protection structure 350 of the semiconductor light-emitting device 300. Thus, compared to the case where the reflective protection structure 350 completely surrounds the sidewall and the upper surface of the second electrode layer 340, additional residual stress of the reflective protection structure 350 is relaxed by the plurality of first holes 350H, thereby inhibiting the additional residual stress from spreading to the second electrode layer 340, and accordingly, obtaining a more stable electrode structure. A portion of the reflective protection structure 350 that contacts the second electrode layer 340 and the second semiconductor layer 316 is formed of an insulating film, and thus the mechanical shock at the part of the edge portion of the reflective protection structure 350 that contacts the upper surface of the second electrode layer 316 is relaxed, thereby inhibiting the leakage current and the chemical penetration from the external environment, and obtaining a relatively stable structure.

The reflective protection structure 350 is formed of a material for increasing light reflection efficiency, thereby further contributing to improvement of the light reflection efficiency as much as a part of the reflective protection structure 350 covering the second semiconductor layer 316 around the second electrode layer 140. That is, at least a part of light generated in the active layer 314 and emitted toward around the second electrode layer 340 is reflected in the reflection region 350R of the reflective protection structure 350, and thus minimizing an amount of light which does not travel in a desired direction from the active layer 314 and is substantially lost, thereby maximizing substantial light extraction efficiency.

Figure 5:
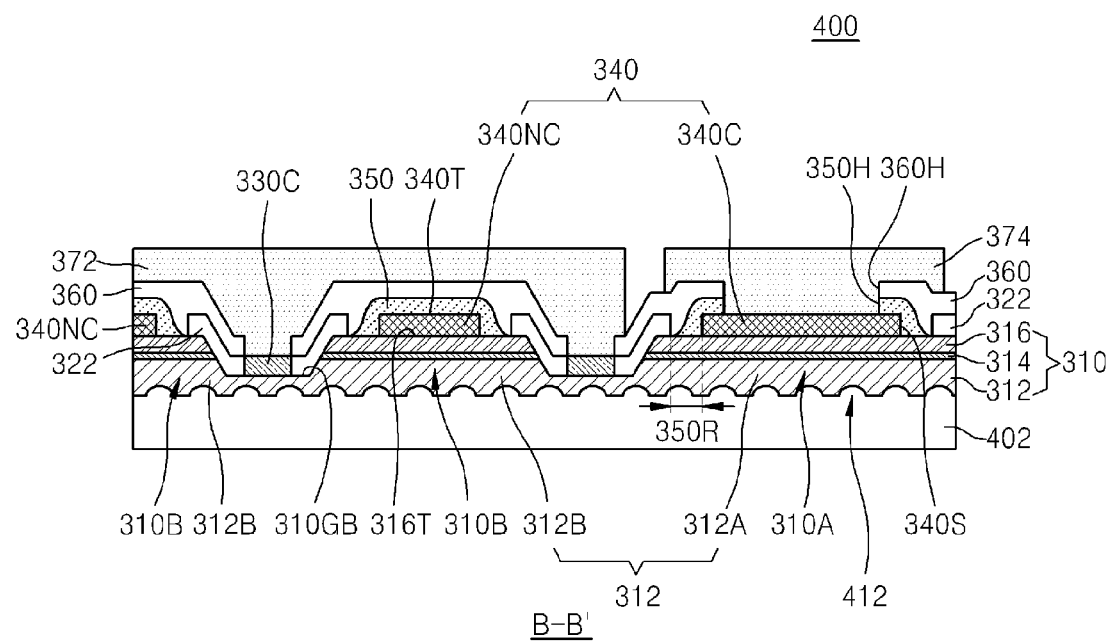
FIG. 5 is a cross-sectional view illustrating a semiconductor light-emitting device according to an exemplary embodiment.

FIG. 5 is a cross-sectional view illustrating a semiconductor light-emitting device 400 according to an exemplary embodiment. The same reference numerals between FIG. 5 and FIGS. 4A through 4C denote the same elements, and detailed descriptions thereof will not be given for brevity of explanation.

The semiconductor light-emitting device 400 has substantially the same structure as that of the semiconductor light-emitting device 300 of FIGS. 4A through 4C except that an uneven pattern 412 is formed on a surface of a substrate 402 facing the first semiconductor layer 312. A detailed description of the substrate 402 is the same as described with reference to the substrate 302 of FIGS. 4A through 4C.

Since the uneven pattern 412 is formed on the surface of the substrate 402, crystallinity of semiconductor layers formed on the substrate 402 is improved and a defect density is reduced, thereby improving internal quantum efficiency. Extraction efficiency due to diffused reflection of light on the surface of the substrate 402 is improved, thereby improving light extraction efficiency of the semiconductor light-emitting device 400.

Figure 6:
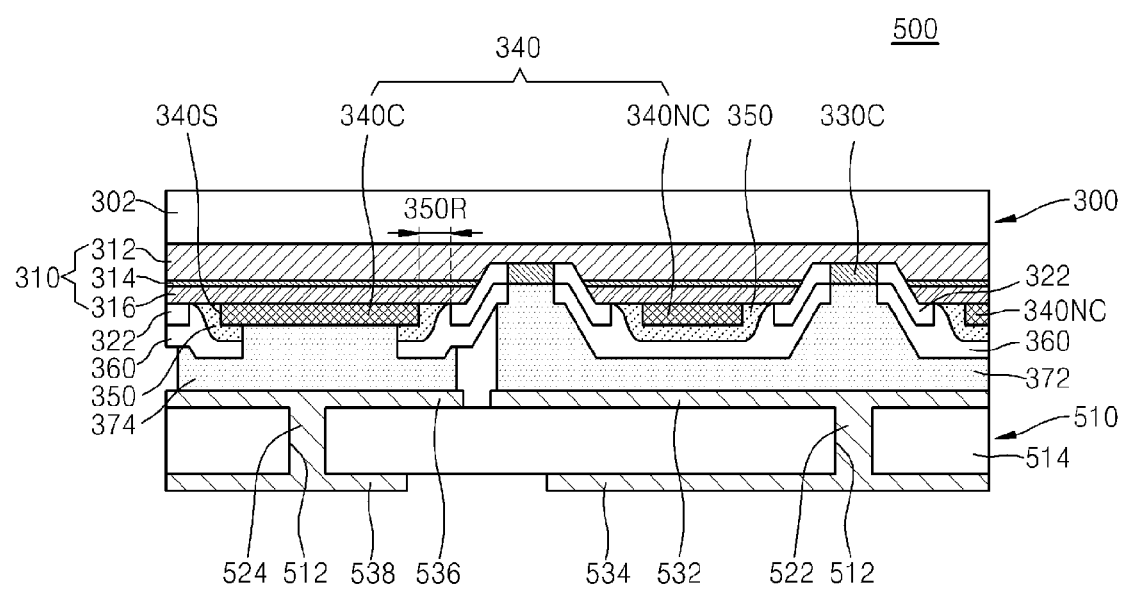
FIG. 6 is a cross-sectional view illustrating elements of a semiconductor light-emitting device according to an exemplary embodiment.

FIG. 6 is a cross-sectional view illustrating major elements of a semiconductor light-emitting device 500 according to an exemplary embodiment. The semiconductor light-emitting device 500 exemplarily has a structure in which the semiconductor light-emitting device 300 of FIGS. 4A and 4B are mounted on a package substrate 510. The same reference numerals between FIG. 6 and FIGS. 4A through 4C denote the same elements, and detailed descriptions thereof will not be given for brevity of explanation.

Referring to FIG. 6, the package substrate 510 includes a substrate body 514 in which a plurality of through-holes 512 are formed, a plurality of through-electrodes 522 and 524 that are formed in the plurality of through-holes 512, and a plurality of conductive layers formed on both surfaces of the substrate body 514. The plurality of conductive layers include a first conductive layer 532 and a second conductive layer 534 that are formed on the both surfaces of the substrate 514 and are respectively connected to both ends of the through-electrode 522, and a third conductive layer 536 and a fourth conductive layer 538 that are formed on the both surfaces of the substrate body 514 and are respectively connected to both ends of the through-electrode 524. The first conductive layer 532 and the third conductive layer 536 formed on one surface of the substrate body 514 are spaced apart from each other, and the second conductive layer 534 and the fourth conductive layer 538 formed on the other surface of the substrate body 514 are spaced apart from each other.

The substrate body 514 may be a circuit substrate such as a printed circuit board (PCB), a metal core PCB (MCPCB), a metal PCB (MPCB), or a flexible PCB (FPCB), or a ceramic substrate formed of AlN or $Al_2O_3$. In an exemplary embodiment, a structure including a lead frame instead of the package substrate 510 of FIG. 6 may be used.

Each of the through-electrodes 522 and 524 and the first through fourth conductive layers 532, 534, 536, and 538 may be formed of Cu, Au, Ag, Ni, W, C, or a combination thereof.

The first bonding conductive layer 372 is connected to the first conductive layer 532, and the second bonding conductive layer 374 is connected to the third conductive layer 536. The first bonding conductive layer 372 and the second bonding conductive layer 374 may be bonded to the first conductive layer 532 and the second conductive layer 536, respectively, by using eutectic die bonding. To this end, the semiconductor light-emitting device 300 of FIGS. 4A and 4B may be disposed on the package substrate 510 such that the first bonding conductive layer 372 and the second bonding conductive layer 374 respectively face the first conductive layer 532 and the third conductive layer 536, and then thermo-compression may be performed at a temperature of about 200 to 700° C. Since the first bonding conductive layer 372 and the first conductive layer 532, and the second bonding conductive layer 374 and the third conductive layer 536 are bonded to each other by using eutectic die bonding, an adhesive force having high reliability and high strength may be maintained.

Although the semiconductor light-emitting device 300 of FIGS. 4A and 4B is mounted on the package substrate 510 in FIG. 6, the semiconductor light-emitting device 400 of FIG. 5 may be mounted on the package substrate 510 by using a method similar to the method described with reference to FIG. 6.

Figure 7:
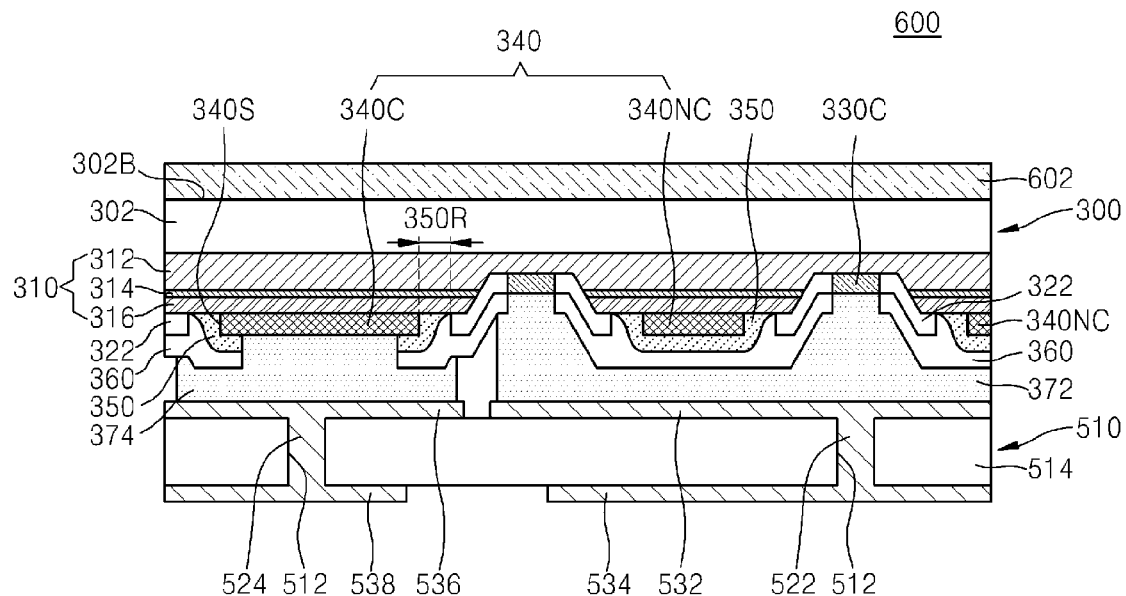
FIG. 7 is a cross-sectional view illustrating elements of a semiconductor light-emitting device according to an exemplary embodiment.

FIG. 7 is a cross-sectional view illustrating elements of a semiconductor light-emitting device 600 according to an exemplary embodiment. The same reference numerals between FIG. 7 and FIGS. 4A through 6 denote the same elements, and detailed descriptions thereof will not be given for brevity of explanation.

The semiconductor light-emitting device 600 has generally the same structure as that of the semiconductor light-emitting device 500 of FIG. 6 except that a rear surface 302B of the substrate 302 is covered by a wavelength conversion unit 602.

The wavelength conversion unit 602 may function to convert a wavelength of light emitted from the semiconductor light-emitting device 300 into another wavelength. In an exemplary embodiment, the wavelength conversion unit 602 may include a resin layer including phosphors or quantum dots.

Figure 8:
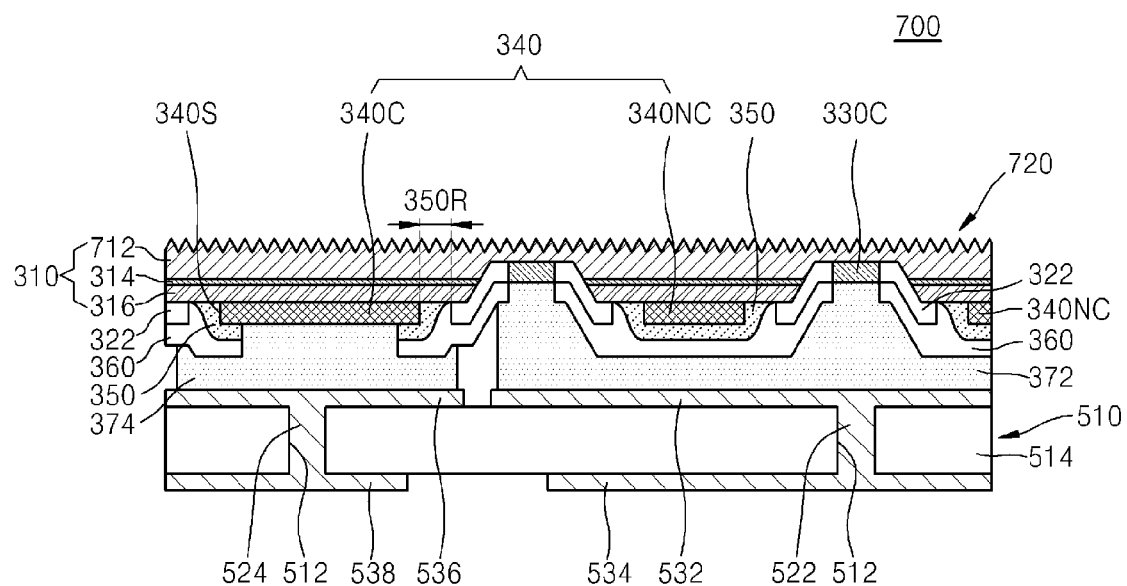
FIG. 8 is a cross-sectional view illustrating elements of a semiconductor light-emitting device according to an exemplary embodiment.

FIG. 8 is a cross-sectional view illustrating elements of a semiconductor light-emitting device 700 according to an exemplary embodiment. The same reference numerals between FIG. 8 and FIGS. 4A through 6 denote the same elements, and detailed descriptions thereof will not be given for brevity of explanation.

The semiconductor light-emitting device 700 includes a first semiconductor layer 712 having an uneven surface 720. In an exemplary process for manufacturing the semiconductor light-emitting device 700, the first semiconductor layer 712 having the uneven surface 720 may be formed by bonding the semiconductor light-emitting device 300 of FIG. 4A to the package substrate 510 by using the first bonding conductive layer 372 and the second bonding conductive layer 374, removing the substrate 302, and periodically forming an uneven pattern having a regular or irregular shape on an exposed surface of the first semiconductor layer 312.

Since the semiconductor light-emitting device 700 includes the first semiconductor layer 712 having the uneven surface 720, thereby suppressing light loss and improving brightness.

Figure 9:
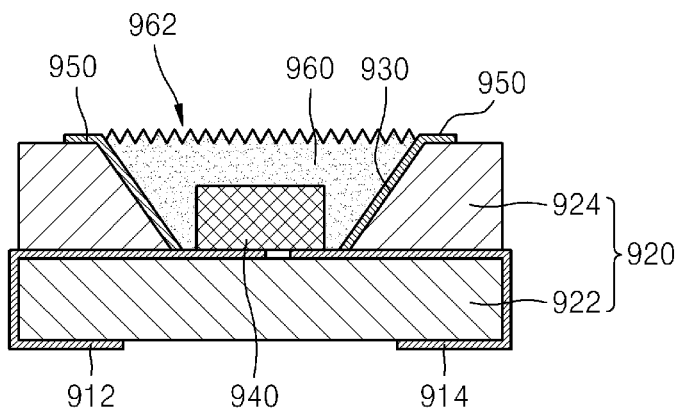
FIG. 9 is a cross-sectional view illustrating major elements of a light-emitting device package according to an exemplary embodiment.

FIG. 9 is a cross-sectional view illustrating elements of a light-emitting device package 900 according to an exemplary embodiment.

Referring to FIG. 9, the light-emitting device package 900 includes a cup-shaped package structure 920 on which electrode patterns 912 and 914 are formed. The package structure 920 includes a lower substrate 922 having a surface on which the electrode patterns 912 and 914 are formed, and an upper substrate 924 having a groove portion 930.

A semiconductor light-emitting device 940 is mounted on a lower surface of the groove portion 930 by using flip-chip. The semiconductor light-emitting device 940 may include at least one of the semiconductor light-emitting devices 100, 100A-100E, 300, 300B, 400, 500, 600, and 700 of FIGS. 1 through 8. The semiconductor light-emitting device 940 may be fixed to the electrode patterns 912 and 914 by using eutectic die bonding.

A reflective plate 950 is formed on an inner wall of the groove portion 930. The semiconductor light-emitting device 940 is covered by a transparent resin 960 that fills the groove portion 930 on the reflective plate 950. An uneven pattern 962 for improving light extraction efficiency is formed on a surface of the transparent resin 960. In an exemplary embodiment, the uneven pattern 962 may be omitted.

The light-emitting device package 900 may be used as a blue light-emitting diode (LED) having high output/high efficiency, and may be used in a large display device, an LED TV, an RGB white lighting device, or a dimming lighting device.

Figure 10:
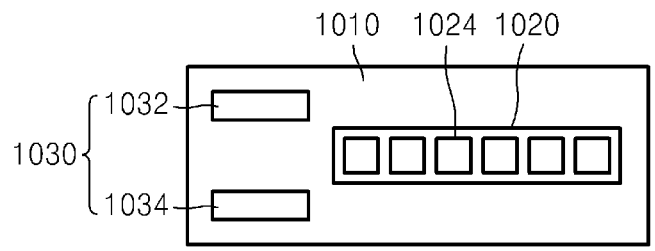
FIG. 10 is a view illustrating a dimming system including a semiconductor light-emitting device, according to an exemplary embodiment.

FIG. 10 is a view illustrating a dimming system 1000 including a semiconductor light-emitting device, according to an exemplary embodiment.

Referring to FIG. 10, the dimming system 1000 includes a light-emitting module 1020 and a power supply unit 1030 that are disposed on a structure 1010.

The light-emitting module 1020 includes a plurality of light-emitting device packages 1024. The plurality of light-emitting device packages 1024 may include at least one of the semiconductor light-emitting devices 100, 100A-100E, 300, 300B, 400, 500, 600, and 700 of FIGS. 1 through 8.

The power supply unit 1030 includes an interface 1032 to which power is input, and a power supply control unit 1034 that controls power supplied to the light-emitting module 1020. The interface 1032 may include a fuse that cuts off over-current, and an electromagnetic shielding filter that shields an electromagnetic interference signal. The power supply control unit 1034 may include a rectification unit and a smoothing unit that convert alternating current which is input as power into direct current, and a constant voltage control unit that converts a voltage into a voltage suitable for the light-emitting module 1020. The power supply unit 1030 may include a feedback circuit device that compares the amount of light emitted by the plurality of light-emitting device packages 1024 with a preset amount of light, and a memory device that stores information such as desired brightness or color rendition.

The dimming system 1000 may be used as an indoor lighting device of a backlight unit, a lamp, or a flat lighting device used for a display device such as a liquid crystal display (LCD) device including an image panel, or as an outdoor lighting device of a signboard or a road sign. Alternatively, the dimming system 1000 may be used as a lighting device for a transportation unit such as a vehicle, a ship, or an airplane, an electric appliance such as a TV or a refrigerator, or a medical device.

Figure 11:
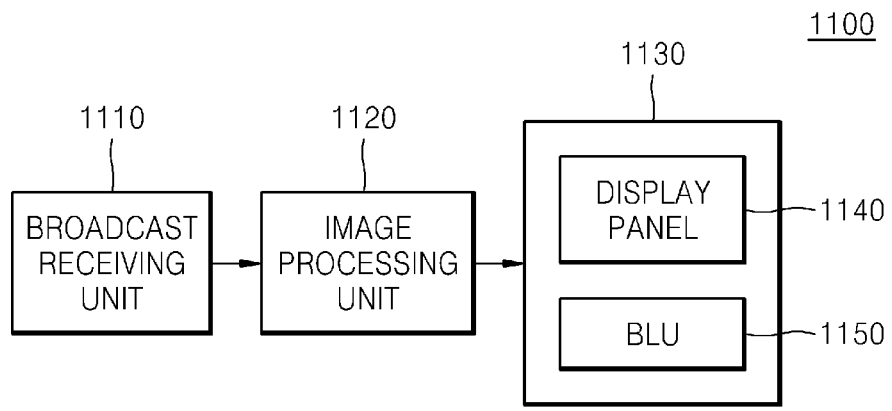
FIG. 11 is a block diagram illustrating a display device including a semiconductor light-emitting device, according to an exemplary embodiment.

FIG. 11 is a block diagram illustrating a display device 1100 including a semiconductor light-emitting device, according to an exemplary embodiment.

Referring to FIG. 11, the display device 1100 includes a broadcast receiving unit 1110, an image processing unit 1120, and a display unit 1130.

The display unit 1130 includes a display panel 1140, and a backlight unit (BLU) 1150. The BLU 1150 includes light sources that generate light and driving elements that drive the light sources.

The broadcast receiving unit 1110 for selecting a channel of a broadcast signal received in a wired or wireless manner through a cable or the air sets an arbitrary channel from among a plurality of channels as an input channel and receives a broadcast signal through the input channel.

The image processing unit 1120 performs signal processing such as video decoding, video scaling, or frame rate conversion (FRC) on broadcast content output from the broadcast receiving unit 1110.

The display panel 1140 may include, but is not limited to, an LCD. The display panel 1140 displays the broadcast content on which signal processing has been performed by the image processing unit 1120. The BLU 1150 projects light to the display panel 1140 so that an image is displayed on the display panel 1140. The BLU 1150 may include at least one of the semiconductor light-emitting devices 100, 100A-100E, 300, 300B, 400, 500, 600, and 700 of FIGS. 1 through 8.

While the inventive concept has been particularly shown and described with reference to exemplary embodiments thereof, it will be understood that various changes in form and details may be made therein without departing from the spirit and scope of the following claims.

What is claimed is:

1. A semiconductor light-emitting device comprising:
   a light-emitting structure comprising a first semiconductor layer, an active layer, and a second semiconductor layer;
   a first electrode layer disposed on the first semiconductor layer;
   a second electrode layer disposed on a first region of an upper surface of the second semiconductor layer;
   a reflective protection structure extending from an upper surface of the second electrode layer to a second region of the upper surface of the second semiconductor layer, the second region surrounding the first region, the reflective protection structure comprising at least one first hole exposing the upper surface of the second electrode; and
   an insulating film extending from an upper surface of the reflective protection structure to a third region of the upper surface of the second semiconductor layer, the third region surrounding the second region and not being covered with the reflective protection structure, the insulating film comprising at least one second hole communicating with the at least one first hole.

2. The semiconductor light-emitting device of claim 1, wherein the reflective protection structure comprises an insulating structure having a refractive index smaller than a refractive index of the second semiconductor layer.

3. The semiconductor light-emitting device of claim 1, wherein the reflective protection structure comprises a plurality of insulating thin films formed of different materials.

4. The semiconductor light-emitting device of claim 1, wherein the reflective protection structure comprises an insulating structure contacting the second semiconductor layer and a metallic reflector film spaced apart from the second semiconductor layer and formed on the insulating structure.

5. The semiconductor light-emitting device of claim 1, further comprising:
   another insulating film disposed between the third region of the upper surface of the second semiconductor layer and the insulating film.

6. A semiconductor light-emitting device comprising:
   a light-emitting device having an upper semiconductor layer;
   an electrode disposed on a first region of an upper surface of the upper semiconductor layer;
   a reflective layer extending from an upper surface of the electrode to a second surface of the upper surface of the upper semiconductor layer, the second region surrounding the first region, the reflective layer comprising at least one first hole that exposes the upper surface of the electrode; and
   an insulating film extending from an upper surface of the reflective layer to a third region of the upper surface of the upper semiconductor layer, the third region surrounding the second region and not being covered with the reflective layer, the insulating film comprising at least one second hole communicating with the at least one first hole.

7. The semiconductor light-emitting device of claim 6, wherein the reflective layer is configured to reflect light that is emitted by an active layer of the light-emitting device towards the electrode.

8. The semiconductor light-emitting device of claim 6, further comprising:
   a conductive layer connected to the exposed portion of the electrode through the reflective layer and the insulating film.

9. The semiconductor light-emitting device of claim 6, further comprising:
   another insulating film disposed between the third region of the upper surface of the upper semiconductor layer and the insulating film.

10. A semiconductor light-emitting device comprising:
   a semiconductor region comprising a light-emitting structure;
   an electrode layer disposed on a first region of an upper surface of the semiconductor region;
   a reflective protection structure extending from an upper surface of the electrode layer to a second region of the upper surface of the semiconductor region, the second region surrounding the first region, the reflective protection structure comprising at least one first hole that exposes the upper surface of the electrode layer;
   an insulating film extending from an upper surface of the reflective protection structure to a third region of the upper surface of the semiconductor region, the third region surrounding the second region and not being covered with the reflective protection structure, the insulating film comprising at least one second hole communicating with the at least one first hole; and
   another insulating film disposed between the third region of the upper surface of the semiconductor region and the insulating film.

* * * * *